(12) United States Patent
Schonfelder et al.

(10) Patent No.: US 6,210,861 B1
(45) Date of Patent: Apr. 3, 2001

(54) TONABLE RADIATION SENSITIVE RECORDING MATERIAL WITH BALANCED ADHESIVE PROPERTIES AND PROCESS FOR USING THE SAME

(76) Inventors: Klaus Uwe Schonfelder, Emminghausstr. 6, 61250 Usingen; Karl-Heinz Wiedenmann, Memelstr, 5A, 6074 Rodermark 2; Uwe Michael Zakrzewski, Goethestr, 22, 6056 Heusenstamm, all of (DE)

( * ) Notice: Subject to any disclaimer, the term of this patent is extended or adjusted under 35 U.S.C. 154(b) by 0 days.

(21) Appl. No.: 08/487,921

(22) Filed: Jun. 7, 1995

Related U.S. Application Data

(63) Continuation of application No. 08/105,098, filed on Aug. 10, 1993, now abandoned.

(30) Foreign Application Priority Data

Aug. 29, 1992 (DE) .................................................. 42 28 790

(51) Int. Cl.⁷ ....................................................... G03C 1/76
(52) U.S. Cl. .................................... 430/271.1; 430/273.1; 430/285.1; 430/286.1; 430/287.1; 430/291
(58) Field of Search .................................. 430/271, 285, 430/286, 287, 291, 273, 271.1, 273.1, 285.1, 286.1, 287.1

(56) References Cited

U.S. PATENT DOCUMENTS

| | | | |
|---|---|---|---|
| 3,060,024 | 10/1962 | Burg et al. | 96/28 |
| 3,582,327 | 6/1971 | Boyd et al. | 96/28 |
| 3,620,726 | 11/1971 | Chu et al. | 96/27 |
| 3,649,268 | 3/1972 | Chu et al. | 96/27 |
| 3,909,282 | 9/1975 | Gray | 106/288 |
| 4,116,786 | 9/1978 | Hodakowski | 204/159.13 |
| 4,215,193 | 7/1980 | Manger et al. | 430/291 |
| 4,243,741 | 1/1981 | Abele et al. | 430/270 |
| 4,326,010 | * 4/1982 | Bauer | 428/483 |
| 4,346,162 | 8/1982 | Abele | 430/270 |
| 4,356,253 | 10/1982 | Buzzell | 430/291 |
| 4,369,240 | * 1/1983 | Fickes | 430/291 X |
| 4,472,021 | 9/1984 | Ansel et al. | 350/96.23 |
| 4,604,340 | 8/1986 | Grossa | 430/270 |
| 4,678,846 | 7/1987 | Weitemeyer et al. | 525/477 |
| 4,689,289 | 8/1987 | Crivello | 430/270 |
| 4,693,960 | 9/1987 | Babick et al. | 430/323 |
| 4,786,577 | 11/1988 | Aoal et al. | 430/192 |
| 4,806,451 | 2/1989 | Frohlich | 430/291 |
| 4,892,802 | * 1/1990 | Bauer et al. | 430/270 |
| 4,963,438 | * 10/1990 | Weitemeyer et al. | 428/447 |

FOREIGN PATENT DOCUMENTS

| | | | |
|---|---|---|---|
| 2032051 | 12/1990 | (CA) | G06G/1/013 |
| 3337303 C2 | 3/1987 | (DE) | G03C/1/68 |
| 329009 A2 | 8/1989 | (DE) | G03F/7/10 |
| 42 04 950 A1 | 9/1993 | (DE) | G03F/7/105 |
| 0 225 454 | 6/1987 | (EP) | G03F/7/10 |
| 0 116 140 B1 | 8/1987 | (EP) | C03C/25/02 |
| 0 360 618 | 3/1990 | (EP) | G03F/7/075 |
| 0 448 285 A2 | 9/1991 | (EP) | G03F/7/075 |
| 1 570 099 | 6/1980 | (GB) | C08L/83/04 |
| 0284863 | 2/1992 | (GB) . | |

OTHER PUBLICATIONS

Research disclosures, Oct. 1973, p. 38–41, No. 11418.

* cited by examiner

Primary Examiner—Mark Chapman

(57) ABSTRACT

A tonable, radiation sensitive composition, whose adhesion properties can be controlled by the presence of a polydiorganosiloxane with polar and/or ethylenic unsaturated groups and a process for preparing multicolored images using such a composition is described.

10 Claims, No Drawings

TONABLE RADIATION SENSITIVE RECORDING MATERIAL WITH BALANCED ADHESIVE PROPERTIES AND PROCESS FOR USING THE SAME

This is a continuation of application Ser. No. 08/105,098 filed Aug. 10, 1993, now abandoned.

FIELD OF THE INVENTION

This invention relates to a tonable, radiation sensitive composition and in particular, to a process for making multicolored images using a composition that contains as a significant component (a) a compound that causes a change in the tackiness of the composition through exposure to actinic radiation and (b) a compound that influences the adhesion properties of the composition.

BACKGROUND OF THE INVENTION

Scanned color separations are used as artwork in the reproduction technique to produce offset- or relief printing plates. The color separations are proofed, before the exposure of the printing plates, using a color proofing process to determine if the later printing result represents an accurate tonal reproduction of the original.

Radiation sensitive recording materials which utilize differences in the tackiness of exposed and unexposed areas are used to form images in color proofing processes. A reproduction process is described for example, in Berg, German Patent 1210321 (U.S. Pat. No. 3,060,024); Chu, German Patent 1904058 (U.S. Pat. No. 3,620,726); Boyd, German Patent 1904059 (U.S. Pat. No. 3,582,327); Chu, German Patent 2004214 (U.S. Pat. No. 3,649,268); Buzzell, U.S. Pat. No. 4,356,253; and Bauer, European Patent 0243933 (U.S. Pat. No. 4,892,802), in which a tacky, photopolymerizable recording material, consisting of a support and a polymerizable layer that contains at least one addition- polymerizable monomer and a photopolymerization initiator, is hardened upon imagewise exposure. The exposed areas loose their tackiness in this case. The latent image is made visible by applying suitable toning materials, which adhere only to the unexposed, tacky areas. Excess toner can be removed from the exposed, non-tacky areas after the application. With this process, one obtains positive toned images of the artwork that look like pictures that were produced using printing inks.

Negative images of the artwork are obtained using light sensitive materials such as those described in Abele, U.S. Pat. No. 4,243,741; Abele, U.S. Pat. No. 4,346,162; and Grossa, U.S. Pat. No. 4,604,340. These recording materials contain as light sensitive components either a dihydropyridine compound or a system from a dihydropyridine compound and a hexaarylbisimidazoyl compound.

Application of toner materials that consist mainly of fine particle powders can be carried out by dusting the imagewise exposed surface as described, for example, in Manger, U.S. Pat. No. 4,215,193, and Gray, U.S. Pat. No. 3,909,282. In another embodiment, the toner can be loosely attached to a special carrier and then transferred to the imagewise exposed surface by contacting it with this carrier. Such pigmented carrier layers are described in Frohlich, U.S. Pat. No. 4,806,451, and Metzger, Canadian Patent 2,032,051.

The radiation sensitive recording materials consist usually of a support, a radiation sensitive layer and a coversheet. This coversheet is removed and the material is laminated to a receptor before the imagewise exposure takes place. The support can be removed before or after the exposure, depending on the material.

A recurring problem with this process is the inability to separate the coversheet cleanly from the radiation sensitive layer before lamination to the receptor, because the adhesion of the radiation sensitive layer to the coversheet is too high. Either the radiation sensitive layer separates partially from the support or some areas of the layer are pulled off by the coversheet. Naturally, such damaged layers can not be used for the color proofing process.

The adhesion balance between the radiation sensitive layer and the support can be improved somewhat by the addition of aliphatic polyesters with molecular weights between 1500 and 40000, such as described in Bauer, U.S. Pat. No. 4,326,010. However the difficulties described above can still occur.

Special polyorganosiloxane compounds are used because of their adhesion properties in release layers such as those for the supports of tacky labels. These are described in Weitemeyer, U.S. Pat. No. 4,678,846; Weitemeyer, European Patent 284,863; and Weitemeyer, U.S. Pat. No. 4,963,438. Such release layers, however, can not be compared with the tonable, radiation sensitive layers used in the described color proofing process, because they have to be removable from both the coversheet and the support, while still demonstrating good adhesion to the receptor as well as to the other recording layers.

Polydimethylsiloxane is known from Nakamura, German Patent 3,337,303, as a material used to prevent the sticking of a photomask to photoresist materials. It is however unsuitable for use in the named tonable recording materials, since layers that contain polydimethylsiloxane, do not adhere sufficiently to the other recording layers.

Special silanes are suitable as additives for photoresist films, having a reduced residual layer after development as described in Lauke, European Patent 329,009. This does not suggest, however, that silanes can be used for recording materials for color proofing processes, which have to have very specific adhesion balances.

Accordingly, one purpose of this invention is to eliminate the above-described problems in the color proofing process by optimizing the adhesion balance of a tonable, radiation sensitive recording layer to a coversheet and a support, in a way that allows selective removal of the coversheet first but the support is also removable. This must be achieved without damaging the recording layer during either removal process and without influencing the adhesion of the recording layer to the receptor or to other recording layers. In addition, a defect free toner application to the imagewise exposed layer must be assured.

SUMMARY OF THE INVENTION

This invention describes a tonable, radiation sensitive composition comprising:
 (a) at least one compound, that after exposure with actinic radiation, causes a change in the tackiness of the composition;
 (b) a photoinitiator or a photoinitiator system;
 (c) a compound selected to influence the adhesion properties of the composition; and
 (d) optionally a polymeric binder or a binder composition; wherein at least one polydiorganosiloxane with polar and/or ethylenic unsaturated groups is used at least partially to control the adhesion.

In another embodiment, a process for forming colored images using this composition is described.

DETAILED DESCRIPTION OF THE INVENTION

Suitable additives to control the adhesion properties of tonable, radiation sensitive recording layers are according to the invention polydiorganosiloxanes with polar and/or unsaturated groups. Alkyl, substituted alkyl, aryl and substituted aryl groups are suitable organo groups. Especially suitable are alkyl groups with 1 to 5 carbon atoms and phenyl groups. Acryl and/or methacryl groups can be used as ethylenic unsaturated groups. Suitable polar groups are amino, hydroxy, carboxy, alkoxy, halo, epoxy and carboxylic acid esters. Hydroxy, carboxy and alkoxy groups are especially preferred.

The polysiloxanes should have a minimum of 10 siloxane units, preferably 20 to 60 of such units, especially recommended 25 to 40. alpha, omega-Hydroxy functional polydimethylsiloxane-polycaprolactone copolymers have shown themselves as especially suitable. The number of caprolactone units should be at least 3, preferably 5 to 40, and more preferably 7 to 30. The molecular weight of the polydiorganosiloxane is preferably equal to or greater than 2,000, especially 3,000 to 15,000.

The named polysiloxanes can be used as the only adhesion additive or in combination with other such additives. Suitable for mixtures are for example the polyesters described in Bauer, U.S. Pat. No. 4,326,010, especially polycaprolactones.

The tonable, radiation sensitive mixtures according to the invention should contain 0.05 to 0.7% by weight of polydiorganosiloxanes with polar and/or unsaturated groups. When used in mixtures with other adhesion additives, 0.05 to 0.20% by weight of the polysiloxanes of this invention are preferred. Especially preferred, however, is the use of these polysiloxanes as the only additives for controlling the adhesion properties of the composition. In this case, 0.3 to 0.7 weight % is preferred.

Positive tonable, photohardenable compositions such as those described, for example, in Berg, German Patent 1210321 (U.S. Pat. No. 3,060,024); Chu, German Patent 1904058 (U.S. Pat. No. 3,620,726); or Chu, German Patent 2004214 (U.S. Pat. No. 3,649,268), as well as negatively tonable, systems that become tacky after exposure, as described, for example, in Abele, U.S. Pat. No. 4,243,741; Abele, U.S. Pat. No. 4,346,162; and Grossa, U.S. Pat. No. 4,604,340, can be used in the radiation sensitive compositions of this invention. The named negatively tonable recording materials contain either a dihydropyridine compound or a light sensitive composition formed from a hexaarylbisimidazole compound and a dihydropyridine.

Positive tonable photopolymerizable recording materials are preferentially used for this invention. The materials described in Bauer, U.S. Pat. No. 4,734,356, and Bauer, European Patent 0243933 (U.S. Pat. No. 4,892,802), are especially preferred. These materials contain a polymeric binder, at least one photopolymerizable compound, a photoinitiator and, optionally, other additives such as plasticizers, sensitizers, fillers, antioxidants and brighteners. The preferred binders, described in Bauer, European Patent 0243933 (U.S. Pat. No. 4,892,802), either have a glass transition temperature equal to or lower than 70° C., or, if they contain metal ions, have a glass transition temperature equal to or lower than 80° C. The latter are crosslinked by the addition of metal ions. Thermoplastic binders based on polyacrylate and/or polymethacrylate that have the salt forming groups in the form of either acrylic acid or methacrylic acid have proven especially useful. The metal ions are preferably magnesium, calcium, strontium, barium, aluminum, tin, zinc, cadmium, titanium, zirconium and manganese. They are added as salts, preferably as chelates. The amount of binder, or mixture of binders is generally 20 to 90 weight %, preferably 30 to 70 weight %, relative to the total weight of the dry recording layer. The amount of salt forming groups is 2 to 20 weight %, preferably 2 to 15 weight %, whereby at least 10 weight % of these groups should be crosslinked through the metal ions.

The known monomers and oligomers are suitable as photopolymerizable compounds. Preferably used are compounds with several addition polymerizable, ethylenic unsaturated groups. Combinations of these compounds are also possible. Especially suitable are acrylic- and methacrylic acid from multivalent acyclic and cyclic polyols as well as aromatic hydroxy compounds, such as ethylene glycol diacrylate; diethylene glycol diacrylate; glycerin di- and triacrylate; 1,3-propanediol dimethacrylate; trimethylolpropane trimethacrylate; hexamethyleneglycol diacrylate and the bisacrylates; and the bismethacrylates of bisphenol-A alkoxylated with epichlorohydrin, as described in Bauer, U.S. Pat. No. 4,734,356. The monomers are usually used in amounts of 10 to 80 weight %, preferably 20 to 60 weight %.

Practically all compounds known as photoinitiators can be used in amounts from 0.01–15 weight percent. Examples of suitable photoinitiators and photoinitiators systems are: dibenzoyl, dibenzoyldimethylketal, benzoin, benzoinisopropylether, alphamethylbenzoin, 1,4-naphthoquinone, Michler's ketone and benzophenone as well as systems of substituted thioxanthones and tertiary amines.

In addition, 5 to 30 weight percent of one or several plasticizers may be used, for example: alkyl phosphates; polyethyleneglycols: polyethylene oxides; and diesters of phthalic acid, adipic acid and caproic acid. Liquid acrylate and/or methacrylate polymers or butadiene/acrylonitrile co-polymers with salt forming groups are preferred.

Using known methods, the tonable, radiation sensitive compositions, can be coated on suitable, preferably transparent, supports and then dried. Suitable supports are, for example, plastic films from polyethylene, polypropylene, polyamide and polyester. Polyethylene terephthalate film is the preferred support. If non-transparent supports are used, they will be removed before the imagewise exposure.

The side of the recording layer opposite the support is covered with a flexible coversheet, such as a thin film of polystyrene, polyethylene, polypropylene or poly-ethylene terephthalate. Polypropylene film is preferred.

The thickness of the recording layer can be between 2 microns and 1 millimeter depending on the desired application.

The radiation sensitive materials have their maximum sensitivity in the ultraviolet region, preferably in the wavelength between 250 and 450 nm. All radiation sources that supply an effective amount of this radiation are therefore suitable for the exposure. For example, xenon lamps, mercury vapor lamps and carbon arc lamps, lasers, fluorescent lamps with ultraviolet emitting phosphors, and electronic flashes are all suitable.

The toning of the imagewise exposed recording layer can be accomplished by dusting with toner materials that consist mainly of finely divided powders, such as those described in Manger, U.S. Pat. No. 4,215,193, and Gray, U.S. Pat. No. 3,909,282. It can also be done with pigmented toning foils, that contain the toning material loosely bound on a separate carrier. Such toning foils are described in, for example, Metzger, Canadian Patent 2,032,051; Frohlich, U.S. Pat. No. 4,806,451; and Delaney, U.S. Pat. No. 4,902,363.

INDUSTRIAL APPLICABILITY

The composition of this invention can, for example, be used advantageously for the reproduction of line and screen images in graphic arts and other industrial applications. One primary application however, lies in the production of single- and multicolored images and in color proofing processes.

The procedure for using the radiation sensitive composition of the invention in a color proofing process consists of the following process steps. After the removal of the coversheet, a positively tonable photopolymerizable recording material is laminated to a receptor, whereby the photopolymerizable layer has a higher adhesion to the surface of the receptor than to the support, both in the polymerized and the unpolymerized state.

Paper, cardboard, metals, films or plates made from polymers such as polyethylene, polyester, polyvinyl chlorides, polyamides are suitable receptors. The receptor can be unchanged or have a coating that contains, in addition to the normal components, other substances such as pigments, fillers, optical brighteners, ultraviolet absorbers, and antistatic agents. Then the material is exposed by actinic radiation through the transparent support and art work, e.g., a scanned color separation positive of a first color yielding non-tacky areas in the exposed areas. The support is then removed by delaminating. The latent image formed on the receptor is made visible by applying a toner that adheres to the unexposed areas of the layer. The toner is removed from the hardened areas, leaving them totally free of toner.

A second layer of the photopolymerizable material is then laminated to the picture after removal of the coversheet. It is exposed and toned under the same conditions using a scanned color separation positive of a second color as art work. This step is then repeated with the color separation for a third color and if desired for a scanned black separation positive. Hence, a four color picture corresponding to the color separations is obtained.

Subsequently, a protective layer can be applied to the single or multi-colored picture. This protective layer can consist of an additional laminate of the photohardenable material, from which after an overall exposure, the support is removed.

If a negatively tonable recording material, one that becomes tacky after exposure, is used, the process is the same except that a scanned color separation negative is used instead of the scanned color separation positive.

With the tonable, radiation sensitive compositions of this invention, or the recording materials made from them, the color proofing processes described can be performed significantly simpler and with fewer problems, since when the coversheet is removed from the recording layer defects do not form in the layer nor does the support delaminate. In addition, the recording layers adhere well to each other and to the receptor and a defect free toning quality is guaranteed.

The following examples illustrate the invention. The ingredients are listed by weight unless otherwise noted.

EXAMPLES

Example 1

(Comparison Example)

A photopolymerizable recording material of the type disclosed in Bauer, European Patent 0243933 (U.S. Pat. No. 4,892,802) was generated according to Example 7 of the Bauer patent.

The 15% solution in dichloromethane contained: diacrylate ester of a bisphenol-A-epoxy resin, formed from bisphenol-A and epichlorohydrin, 18.48 g (viscosity at 25° C. 1,000,000 cps); trimethylolpropane trimethacrylate, 13.66 g; 7-(4'-chloro-6'-diethylamino-1',3',5',-triazin-4'-yl)-amino-3-phenyl-coumarin, 2.06 g; 2-mercaptobenzoxazole, 0.83 g; 2,2'-bis (o-chlorophenyl)-4,4',5,5',-tetraphenylbisimidazol, 1.71 g; trimethylolpropane, 5.08 g; glycerol triacetate, 6.75 g; methoxyhydroquinone, 0.022 g; 1,4,4-trimethyl-2,3-diazobicyclo-(3,2,2,)-non-2-en-2,3-dioxide, 0.05 g; diethylhydroxylamine, 0.09 g; ethylacrylate/-methyl methacrylate/acrylic acid copolymer (57/39/4), molecular weight (MW): 192,000, 18.06 g; ethylacrylate/acrylate copolymer MW: 7,000, Tg: −14° C., 5.40 g; ethylacrylate/methyl methacrylate/acrylic acid copolymer (17/71/12), MW: 200,000, 25.15 g; zinc acetyl acetonate, (2.45 g) dissolved in 37.0 g methanol, 39.45 g; polycaprolactone, MW: 15000, 0.20 g.

This coating solution was coated on a polyethylene terephthalate film (12.5 microns), so that after drying a 4 micron thick polymerizable layer was obtained. Then a 19 micron thick polypropylene coversheet was laminated to this layer. The force required to remove the coversheet from the photopolymerizable recording layer was measured as described in Bauer, U.S. Pat. No. 4,326,010, using an Instron® Model 4301 Universal Tester. The coversheet was removed at an angle of about 180° to the edge of the recording layer. The removal force for this material was 4.5 N/200 mm.

Example 2

Two photopolymerizable recording materials were produced as described in Example 1, however they contained in addition 0.1% for the first material and 0.3% for the second material of a alpha, omega-hydroxyfunctional polydimethylsiloxane-polycaprolactone copolymer with about 30 siloxane units, about 27 caprolactone units and a molecular weight of about 8,550. The coversheets could be removed more easily from the recording layers and without defects. The removal forces were 3.0 N/200 mm (for 0.1% copolymer) and 1.7N/200 mm (for 0.3% copolymer). The adhesion to the support was not negatively influenced.

Example 3

Two photopolymerizable recording materials were produced as described in Example 1, however they contained in addition 0.05% in the first material and 0.3% in the second material of a acrylate functional polydimethylsiloxane with a viscosity of about 1400 mPa.s. The coversheet could be removed more easily and without defects from both recording layers. The removal forces were 2.6 N/200 mm (0.05%) and 0.7 N/200 mm (0.3%), respectively. The adhesion to the support was not negatively influenced.

Example 4

A photopolymerizable recording material was produced analogous to Example 1, except that the polycaprolactone was replaced by 0.5% of the polysiloxane described in Example 2. The adhesion to the coversheet (1.3 N/200 mm) was significantly reduced in comparison to material without any adhesion additive (5.6 N/200 mm). The coversheet could be more easily removed when compared to the material in Example 1 and the adhesion to the support was not negatively influenced.

Example 5

As described in Example 4, a photopolymerizable recording material was produced, that contained as additive only a polysiloxane; 0.5% of a alpha, omega-hydroxyfunctional polydimethylsiloxane-polycaprolactone copolymer with about 30 siloxane units, about 9 caprolactone units and a molecular weight of about 4,550. With this material the coversheet could also be easily removed without negatively affecting the adhesion to the support. (The removal force was 0.8 N/200 mm.)

Example 6

Four photopolymerizable recording materials according to Example 2 and pigmented transfer layers of the colors cyan, magenta, yellow, and black according to Example 12 in the Metzger, Canadian Patent 2,032,051, were prepared for the formation of a four color proof. After the coversheet was removed, the first photopolymerizable recording material was laminated to a receptor. It was then exposed through a scanned cyan color separation positive in a vacuum frame using a metal halide lamp (3000 watt) and an ultraviolet filter at a distance of 95 cm for 42 sec. After the support was removed, the cyan transfer layer was laminated to the imagewise exposed layer and immediately peeled off. The pigment from the transfer layer adhered only to the unexposed, tacky areas, and a positive cyan image of the art work was obtained.

A second layer of the positively tonable photopolymerizable recording material was laminated to the cyan image and exposed through the corresponding magenta color separation as described above. After the support was removed, the magenta transfer layer was laminated to the imagewise exposed layer and peeled off. The pigment from the transfer layer adhered only to the unexposed, tacky areas, and a positive magenta image was obtained. The process steps were repeated for the colors yellow and black. Then a protective layer is applied in the normal way. A four color proof of excellent brightness and sharpness with a resolution from 1% to 99% dots on a 60 line/cm screen, which represents an exact replication of the original, was obtained. The coversheets of the recording materials could be removed easily and without defects. The adhesion of the recording layers to each other and to the receptor was excellent.

Having described the invention, we now claim the following and their equivalents.

What is claimed is:

1. A tonable, radiation sensitive recording material comprising:
   a) a support;
   b) a tonable, radiation sensitive layer which adheres to the support; and
   c) a coversheet which adheres to the tonable, radiation-sensitive layer and wherein the support has greater adhesion to the tonable, radiation-sensitive layer than the cover layer;
   wherein said tonable, radiation sensitive layer further comprises i) at least one compound which after exposure to actinic radiation causes a change in the tackiness of the composition; ii) a photoinitiator; iii) a polymeric binder; and iv) a polydiorganosiloxane with polar and/or ethylenic unsaturated groups wherein said polydiorganosiloxane at least partially controls the adhesion balance of the tonable, radiation-sensitive layer to the support and the coversheet and is present in 0.05 to 0.7% by weight relative to the weight of the tonable, radiation-sensitive layer and excluding polydimethylsiloxane.

2. A process for the formation of images comprising:
   a) laminating to a receptor after removing the coversheet the tonable, radiation sensitive recording material of claim 1;
   b) imagewise exposing through the support the tonable, radiation sensitive layer;
   c) peeling off the support; and
   d) applying a toning material to the tacky areas of the exposed layer.

3. A process for the formation of multicolored images comprising:
   a) laminating to a receptor after removing the coversheet the tonable, radiation sensitive recording material of claim 1;
   b) imagewise exposing through the support the tonable, radiation sensitive layer;
   c) peeling off the support;
   d) applying a toning material to the tacky areas of the exposed layer; and
   e) repeating steps a) through d) one or more times, whereby in step a) a new layer of tonable, radiation sensitive recording material is laminated to the previously formed radiation sensitive layer, which had been processed according to steps a) through d) to produce a one-color image.

4. The process of claim 2 or 3, wherein the support is removed prior to imagewise exposure.

5. The tonable, radiation sensitive recording material of claim 1 wherein said radiation sensitive layer is a positive working tonable layer.

6. The tonable, radiation sensitive recording material of claim 1, wherein said polydiorganosiloxane contains alkyl groups with 1 to 5 carbon atoms and/or phenyl groups.

7. The tonable, radiation sensitive recording material of claim 1, wherein said polydiorganosiloxane contains a polar group selected from the group consisting of hydroxy, alkoxy, and carboxy.

8. The tonable, radiation sensitive recording material of claim 7, wherein said polydiorganosiloxane contains at least 10 siloxane units.

9. The tonable, radiation sensitive recording material of claim 1, wherein said polydiorganosiloxane is a polydiorganosiloxane/polyester copolymer.

10. The tonable, radiation sensitive recording material of claim 9, wherein said polydiorganosiloxane/polyester copolymer contains at least 10 siloxane units.

* * * * *